United States Patent [19]
Miyatake et al.

[11] Patent Number: 4,934,826
[45] Date of Patent: Jun. 19, 1990

[54] BLOCK PARTITIONED DYNAMIC SEMICONDUCTOR MEMORY DEVICE

[75] Inventors: Hideshi Miyatake; Hiroyuki Yamasaki; Masaki Shimoda; Kazuhiro Tsukamoto, all of Kyogo, Japan

[73] Assignee: Mitsubishi Denki Kabushiki Kaisha, Tokyo, Japan

[21] Appl. No.: 211,548

[22] Filed: Jun. 24, 1988

[30] Foreign Application Priority Data

Jun. 24, 1987 [JP]   Japan ................................ 62-158276

[51] Int. Cl.⁵ ............................................ G11C 13/00
[52] U.S. Cl. ............................... 365/222; 365/189.01; 365/230.01
[58] Field of Search ............. 365/222, 189.01, 189.03, 365/230.01, 230.06

[56] References Cited
U.S. PATENT DOCUMENTS 3,737,879  6/1973  Greene et al. ...................... 365/222

OTHER PUBLICATIONS

Bill Johnston, "The 64-K RAM: Which Way to Refresh?", *Electronics*, Jan. 4, 1979: 145,147.

*Primary Examiner*—Terrell W. Fears
*Attorney, Agent, or Firm*—Lowe, Price, LeBlanc, Becker & Shur

[57] ABSTRACT

A word line driving signal generating circuit and a sense amplifier activating signal generating circuit are provided for every partitioned memory cell array. When the levels of an external RAS signal and an external CAS signal have a predetermined relation and an external RNC signal remains at a predetermined potential or more, a refresh operation is started. A refresh address is generated from a refresh address counter in a sense restore control circuit. All of the memory cell arrays are simultaneously refreshed in response to the address. On this occasion, an operation for selecting a column by a column decoder provided in each of the memory cell arrays is inhibited. In the case in which an input of the external RNC signal is not prepared, when the levels of the external RAS signal and the external CAS signal have a predetermined relation and this state is held in a predetermined time period or more, the same refresh operation as described above is started.

9 Claims, 11 Drawing Sheets

BLOCK PARTITIONED DYNAMIC SEMICONDUCTOR MEMORY DEVICE

BACKGROUND OF THE INVENTION

1. Field of the Invention

The present invention relates generally to semiconductor dynamic RAMs, and more particularly, to refresh operation of block partitioned semiconductor dynamic RAMs.

2. Description of the Prior Art

In recent years, as a semiconductor dynamic RAM (referred to as DRAM hereinafter), many block partitioned DRAMs have been developed to direct larger capacity of the memory as well as smaller power consumption at the time of operating the memory.

FIG. 1 is a block diagram showing a conventional block partitioned MOS (metal oxide semiconductor) type DRAM.

In FIG. 1, partitioned memory cell arrays 8a and 8b are provided with row decoder 6a and 6b and sense amplifier and I/O controls 9a and 9b, respectively. In addition, the memory cell arrays 8a and 8b are provided with a common column decoder 10. The memory cell arrays 8a and 8b include memory cells (not shown) arranged in a plurality of rows and columns, respectively. Address signals $A_0$ to $A_8$ are applied to a row address buffer 2 and a column address buffer 3 through an address input portion 1. The row address buffer 2 generates row address signals $RA_0$ to $RA_8$. The column address buffer 3 generates column address signals $CA_1$ to $CA_8$. A word line driving signal generating circuit 5 is responsive to the row address signals for generating a word line driving signal through a decode signal generating circuit 4. On this occasion, either one of the memory cell arrays 8a and 8b is selected depending on whether the row address signal $RA_0$ is "1" or "0". More specifically, the row address signals $RA_1$ to $RA_8$ are applied to only either one of the row decoders 6a and 6b depending on the value of the row address signal $RA_0$. The selected row decoder is responsive to the row address signals $RA_1$ to $RA_8$ for selecting one row of the memory cells in the selected memory cell array. Only a sense amplifier and I/O control provided in the selected memory cell array is activated in response to an activating signal from a sense amplifier activating signal generating circuit 7. The column decoder 10 is responsive to the column address signals $CA_1$ to $CA_8$ for selecting one column of the memory cells in each of the memory cell arrays 8a and 8b. Thus, information read out from a memory cell determined by a row and a column specified by the row decoder and the column decoder is sensed and amplified by the sense amplifier and I/O control and then, the information is provided to the exterior through a data output buffer 16. The foregoing is the outline of an operation for reading out information. An operation for writing information is basically the same. In this case, information through a data input buffer 18 is written to a specified memory cell in the selected memory cell array.

Thus, in the partitioned memory cell arrays, a sense amplifier provided in a non-selected memory cell array is not activated at the time of a read/write operation of the DRAM, so that the power consumption of the entire DRAM is decreased, as compared with the capacity thereof.

On the other hand, the DRAM is similar in structure of memory cells and suitable for high integration density, as compared with an SRAM (static semiconductor memory device). However, the DRAM uses the principle of storing information charges in a capacitor formed on a semiconductor substrate, so that stored charges are lost with time due to leakage which occurs in a junction between the capacitor and the substrate, or the like. Thus, the DRAM requires a refresh operation for rewriting the stored information every constant time period in order to hold memory. It is the same with a DRAM having partitioned memory cell arrays.

FIG. 2 is a diagram showing specific circuit structure of a portion of one column in each of the memory cell arrays shown in FIG. 1.

In FIG. 2, a plurality of word lines $WL_0$, $WL_1$, ... are arranged intersecting with a bit line pair BL and $\overline{BL}$. A memory cell is provided at an intersection of each bit line BL or $\overline{BL}$ and each word line $WL_0$, $WL_1$, .... In FIG. 2, only two memory cells connected to the two word lines $WL_0$ and $WL_1$ and the bit line pair BL and $\overline{BL}$ are typically shown. The memory cells comprise a set of MOS transistor $T_6$ and capacitor $C_1$ and a set of MOS transistor $T_7$ and capacitor $C_2$, respectively. The bit lines BL and $\overline{BL}$ are connected to a precharge power supply $V_{BL}$ through MOS transistors $T_1$ and $T_2$, respectively. In addition, the bit lines BL and $\overline{BL}$ are connected to each other through an MOS transistor $T_3$. The MOS transistors $T_1$, $T_2$ and $T_3$ have their gates connected to a precharging (equalize) signal $\phi_{pre}$. Furthermore, the bit lines BL and $\overline{BL}$ are connected to a sense amplifier 20 for sensing and amplifying stored charges. The sense amplifier 20 is connected to a ground potential $V_{SS}$ and a power-supply voltage $V_{CC}$ through MOS transistors $T_8$ and $T_9$, respectively. The transistors $T_8$ and $T_9$ have their gates connected to sense amplifier activating signals S and $\overline{S}$, respectively. Additionally, the bit lines BL and $\overline{BL}$ are connected to data input/output lines I/O and $\overline{I/O}$ through MOS transistors $T_4$ and $T_5$, respectively. The transistors $T_4$ and $T_5$ have their gates connected to a column decoder 10.

FIG. 3 is a timing chart showing generating timing of each signal at the time of an automatic refresh operation of the DRAM shown in FIG. 1.

FIG. 4 is a diagram showing a generating circuit of the sense amplifier activating signal S which is generated in response to a word line driving signal RX shown in FIG. 3. The generating circuit comprises inverters 111 of 21 stages.

Referring now to FIGS. 1 to 3, the refresh operation of the conventional DRAM will be described. Description is now made on a refresh operation based on a $\overline{CAS}$ before $\overline{RAS}$ automatic refresh mode which is a recent trend in the refresh operation. An $\overline{RAS}$ (Row Address Strobe) is a timing signal for accepting the address signals for the row decoder. A $\overline{CAS}$ (Column Address Strobe) is a timing signal for accepting the address signals for the column decoder. Such signals are provided to accept the row address signals and the column address signals from the same pin in the DRAM having high integration density. More specifically, respective timing for accepting the row address signals and the column address signals in response to the $\overline{RAS}$ signal and the $\overline{CAS}$ signal are made different. In addition, various timing signals used in the DRAM are generated in response to the signals, so that timing of the entire circuit is controlled.

When the external $\overline{CAS}$ signal falls before the external $\overline{RAS}$ signal ($\overline{CAS}$ before $\overline{RAS}$), a refresh signal REF attains a high level (referred to as "H" level hereinafter) in synchronization with the fall of the external $\overline{RAS}$ signal, so that the refresh signal REF is applied to a sense restore control circuit 12 from a clock generator 14. The sense restore control circuit 12 is responsive to the level of the REF signal for determining whether the DRAM is in a refresh mode or a normal operation (read/write) mode. The sense restore control circuit 12, which received the signal REF of the "H" level, determines that the DRAM is in the refresh mode, to apply a control signal RNC to the decode signal generating circuit 4. The decode signal generating circuit 4, which received the RNC signal, does not select address information inputted from the row address buffer 2. Alternately, the decode signal generating circuit 4 receives a refresh address outputted from a refresh counter (not shown) included in the sense restore control circuit 12, to use the same as an internal address selecting signal of the row decoder. On the other hand, the decode signal generating circuit 4 does not select address information applied to the column decoder in the refresh operation in response to the RNC signal also applied to the column address buffer 3, so that a column system is not operated. Either one of decode signals RAi and $\overline{RAi}$ outputted from the decode signal generating circuit 4 for selecting either one of the memory cell arrays 8a and 8b attains the "H" level in response to the fall of the external RAS signal. In this example, the signal $\overline{RAi}$ attains the "H" level, so that the memory cell array 8b is selected, whereby the refresh address is applied to the row decoder 6b as a word line driving signal RX. One of the word lines, for example, the word line WL₀ in the memory cell array 8b is selected in response to the signal RX, to attain the "H" level. Both the bit lines BL and $\overline{BL}$ are held at a potential of $\frac{1}{2} V_{CC}$ by rendering conductive the precharge power supply $V_{BL}$ which is the potential of $\frac{1}{2} V_{CC}$ because the precharging signal $\phi_{pre}$ is at the "H" level during the time other than the operation time. When the word line WL₀ is selected, the transistors $T_1$, $T_2$ and $T_3$ are turned off, so that the potential of the bit line pair BL and $\overline{BL}$ is rendered electrically floating. Thus, when the word line WL₀ attains the "H" level, the transistor $T_6$ is turned on, so that charges stored in the capacitor $C_1$ is read out to the bit line BL, so that the potential of the bit line BL is changed. On the other hand, since the same amplifier activating signal S attains the "H" level (the sense amplifier activating signal $\overline{S}$ attains the "L" level) after the delay of a predetermined time period from the rise of the signal RX, the power-supply voltage $V_{CC}$ and the ground potential are connected to the sense amplifier 20, respectively. The each potential of the bit lines BL and $\overline{BL}$ becomes the power-supply voltage or the ground potential through the sense amplifier 20 in response to the potential difference between the bit lines BL and $\overline{BL}$, respectively, so that the potentials thereof are amplified, respectively. Since the word line WL₀ is maintained at the "H" level, the amplified potential of the bit line BL ($V_{CC}$ or $V_{SS}$) is directly stored in the capacitor $C_1$. Subsequently, the word line WL₀ attains the "L" level so that the transistor $T_6$ is turned off, and the precharging signal $\phi_{pre}$ attains the "H" level. The potentials of the bit lines BL and $\overline{BL}$ are equalized to return to the state before the refresh operation, so that the refresh operation of a single row address is terminated. In the same manner, refresh operations are successively performed in response to row addresses outputted from the refresh counter. When one cycle of the refresh operations in the selected memory cell array 8b is completed, refresh operations in the memory cell array 8a are performed in the same manner in response to the rise of the decode signal RAi. Consequently, all of the memory cells are refreshed.

The conventional DRAM has a constant cycle time of refresh operations irrespective of whether the capacity is large or small. More specifically, the time required for every one refresh cycle is constant. For example, the DRAM of 256K has a cycle time of 256 cycle/4 ms and the DRAM of 1M has a cycle time of 512 cycle/8 ms. As described above, if the refresh operations are not performed within a predetermined time period, the charges stored in the memory cells change, so that the potential difference which appears on the bit line pair can not be correctly sensed by the sense amplifier 20. This problem naturally becomes larger with increasing capacity of the memory cells. The reason is that the larger the capacity of the memory cells becomes, the longer the time required for one cycle of refresh operations becomes, so that a normal read/write operation is restricted. In addition, when the restriction is desired to be decreased, an interval between the refresh operations becomes long. As a result, the object of the refresh operations is not achieved, so that the reliability of the DRAM is decreased.

Japanese Patent Laying-Open Gazette No. 696/1985 by Matsumura entitled "Semiconductor Memory" discloses a DRAM in which a memory cell array is partitioned into a plurality of blocks, where a memory cycle operation and a refresh operation which are different from each other are simultaneously performed in the blocks, to reduce the number of refresh operations.

In addition, Japanese Patent Laying-Open Gazette No. 122994/1986 by Takemae entitled "Dynamic Semiconductor Memory device" discloses a DRAM in which a memory cell array is partitioned into a plurality of blocks, where an access operation and a refresh operation are performed, respectively, and each of the operations is performed on a priority basis when the operations are simultaneously requested in the same block.

These documents describe that an access operation is performed in a selected block and at the same time, a refresh operation is performed in a non-selected block, to reduce the number of refresh operations, thereby to improve the busy rate. However, the documents fail to disclose a method for performing an efficient refresh operation in consideration of only the refresh operation, unlike the present invention.

SUMMARY OF THE INVENTION

An object of the present invention is to provide a dynamic semiconductor memory device with high reliability.

Another object of the present invention is to provide a dynamic semiconductor memory device in which a refresh operation can be completely achieved.

Still another object of the present invention is to provide a dynamic semiconductor memory device in which a refresh operation can be completely achieved with a refresh cycle being constant even if it has a storage region having large capacity.

In order to attain the above described objects, the semiconductor memory device according to the present invention can perform an access operation for every memory cell array, which generally comprises a plurality of memory cell arrays, a plurality of refresh means, mode defining means and refresh control means. Memory cells are arranged in each of the plurality of memory cell arrays. The plurality of refresh means are provided in memory cell arrays, respectively, to refresh the memory cells. The mode defining means defines a normal access mode and a refresh mode. The refresh control means activates all the refresh means in the refresh mode defined by the mode defining means.

In order to attain the above described objects, the semiconductor memory device according to the present invention can perform an access operation for every memory cell array. In accordance with an aspect of the present invention, the semiconductor memory device comprises a plurality of memory cell arrays, a plurality of row selecting means, a plurality of column selecting means, mode defining means, matrix selecting control means, a plurality of refresh means and refresh control means. The plurality of memory cell arrays each have a plurality of memory cells arranged in a plurality of rows and columns. The plurality of row selecting means are provided in the memory cell arrays, respectively, to select the memory cells for every designated row. The plurality of column selecting means are provided in the memory cell arrays, respectively, to select the memory cells for every designated column. The mode defining means defines a normal access mode and a refresh mode. The matrix selecting control means designates a row of the memory cells selected by the column selecting means and does not designate a column of the memory cells selected by the row selecting means, in the refresh mode defined by the mode defining means. The plurality of refresh means are provided in the memory cell arrays, respectively, to refresh the memory cells selected by the column selecting means. The refresh control means activates all of the refresh means in the refresh mode defined by the mode defining means.

The dynamic semiconductor memory device having the above described structure refreshes simultaneously the partitioned memory cell arrays, so that a refresh interval does not be long irrespective of the storage capacity, whereby the refresh operation can be completely achieved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
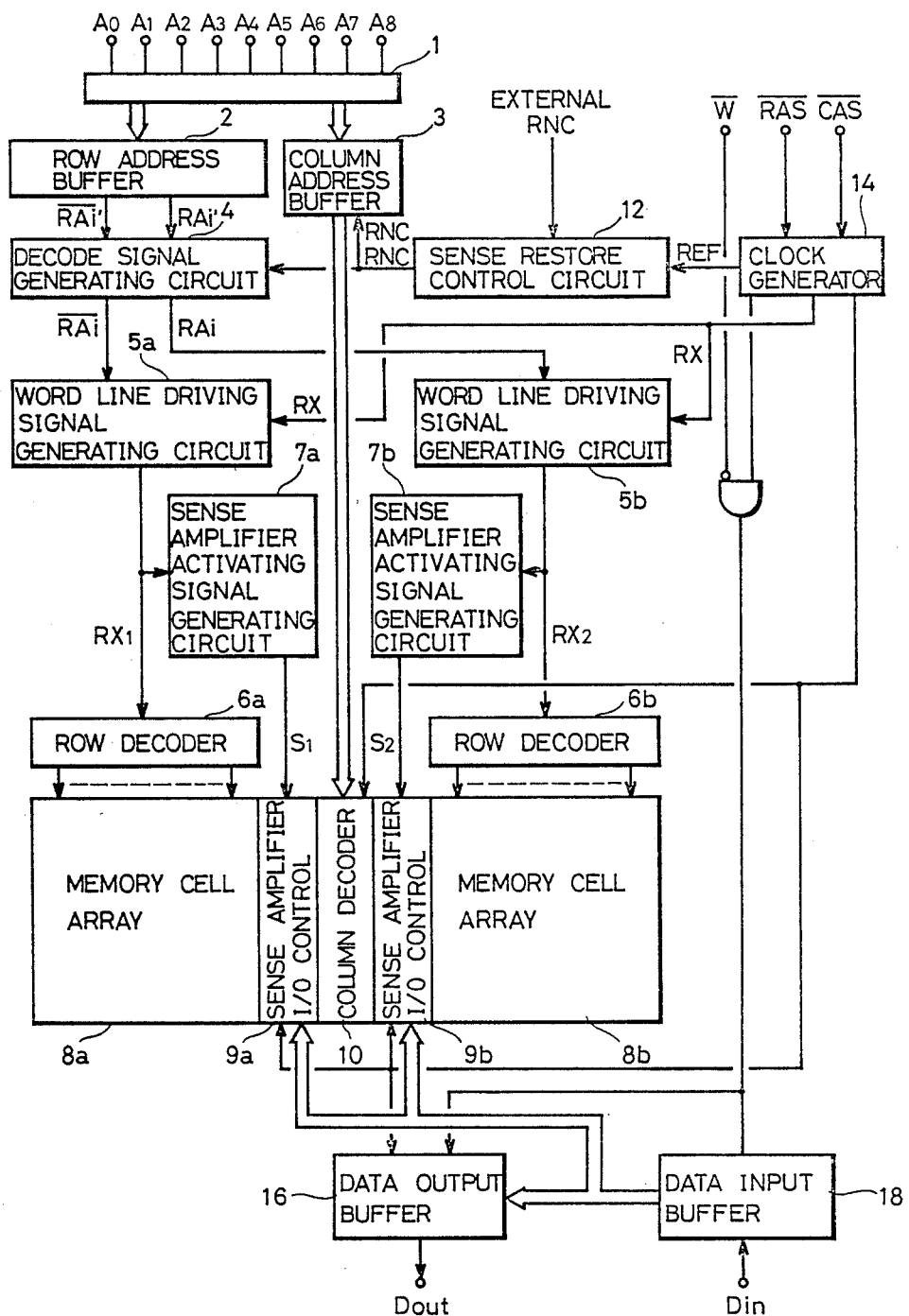
FIG. 5 is a block diagram showing a block partitioned MOS type DRAM according to an embodiment of the present invention.

FIG. 5 is a block diagram showing a block partitioned MOS type DRAM according to an embodiment of the present invention.

Figure 1:
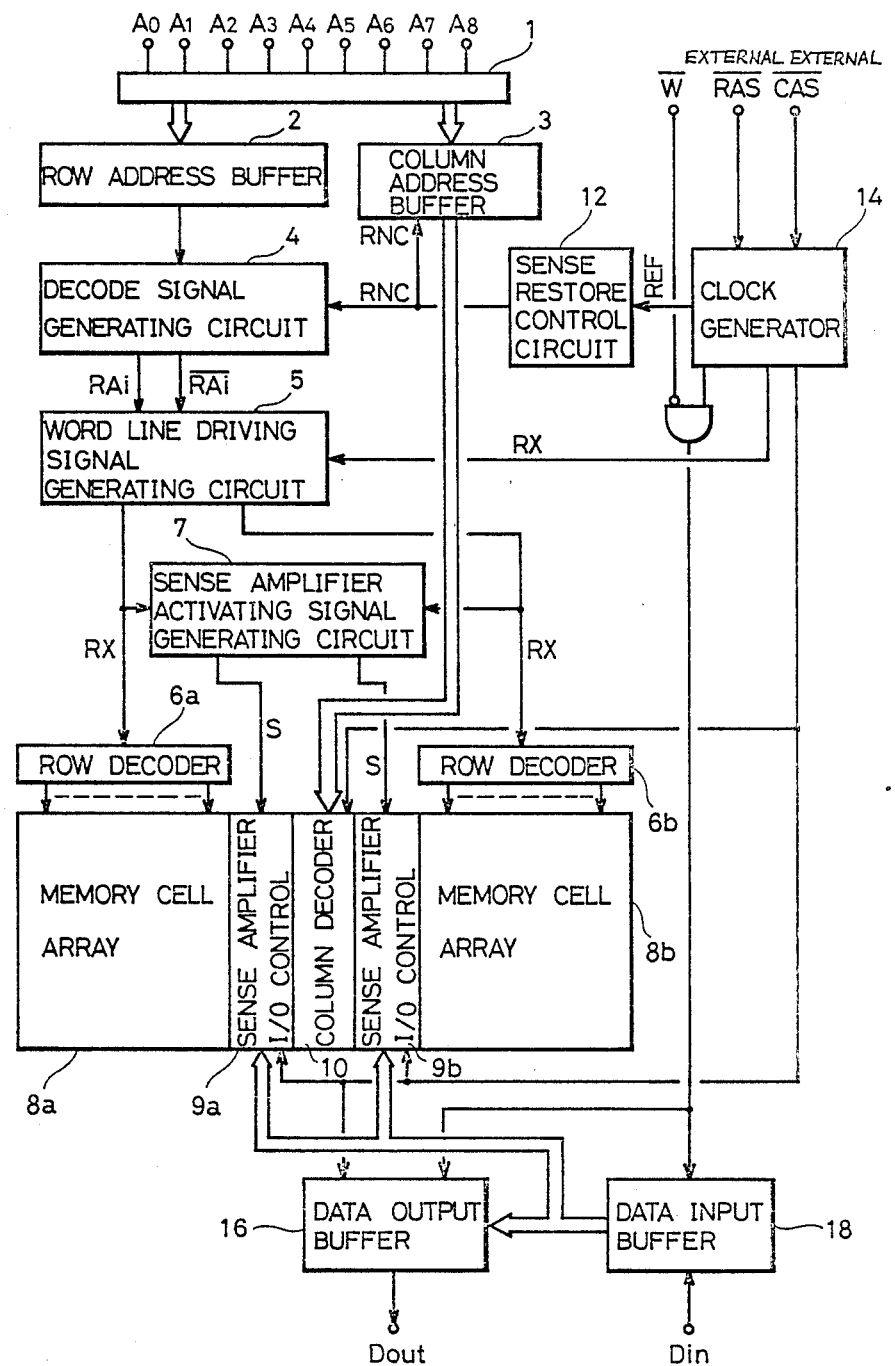
FIG. 1 is a block diagram showing a conventional block partitioned MOS type DRAM.

FIG. 5 is the same as the conventional block diagram of FIG. 1 except that an external RNC signal for a refresh operation is inputted to a sense restore circuit 12, and word line driving signal generating circuits 5a and 5b and sense amplifier activating signal generating circuits 7a and 7b are provided for every two row decoders. The other structure is basically the same as that shown in FIG. 1.

Figure 2:
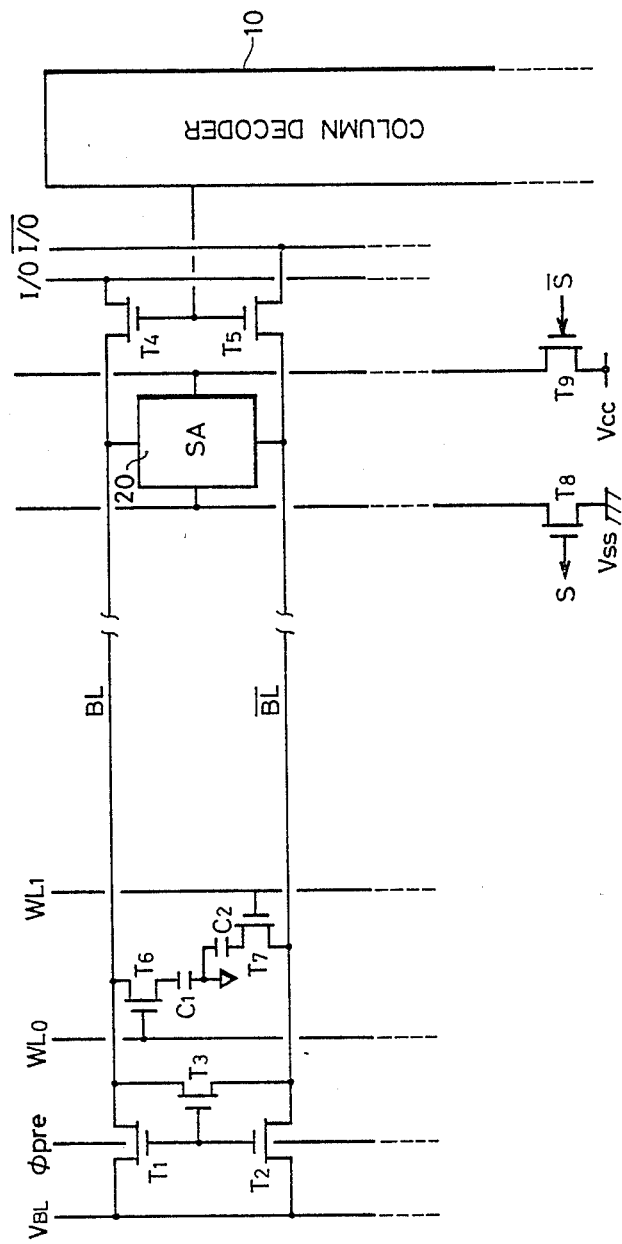
FIG. 2 is a diagram showing specific circuit structure of a portion of one column in each of memory cell arrays shown in FIG. 1.
Figure 3:
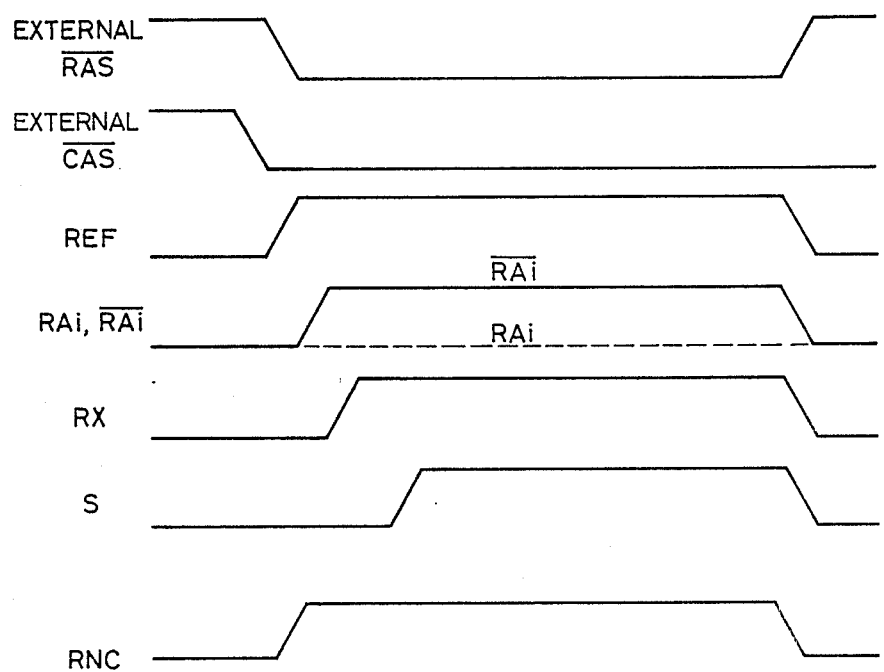
FIG. 3 is a timing chart showing generating timing of each signal at the time of an automatic refresh operation of the DRAM shown in FIG. 1.
Figure 4:
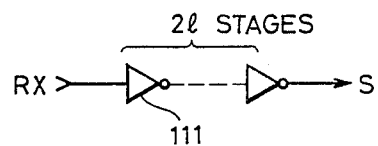
FIG. 4 is a diagram showing a generating circuit responsive to a word line driving signal RX shown in FIG. 3 for generating a sense amplifier activating signal S.

A normal read/write operation is all the same as that in the conventional example. The operation is performed for every region of any of selected memory cell arrays 8a and 8b. Inside structures of each of the memory cell arrays 8a and 8b is the same as that shown in FIG. 2.

Figure 6:
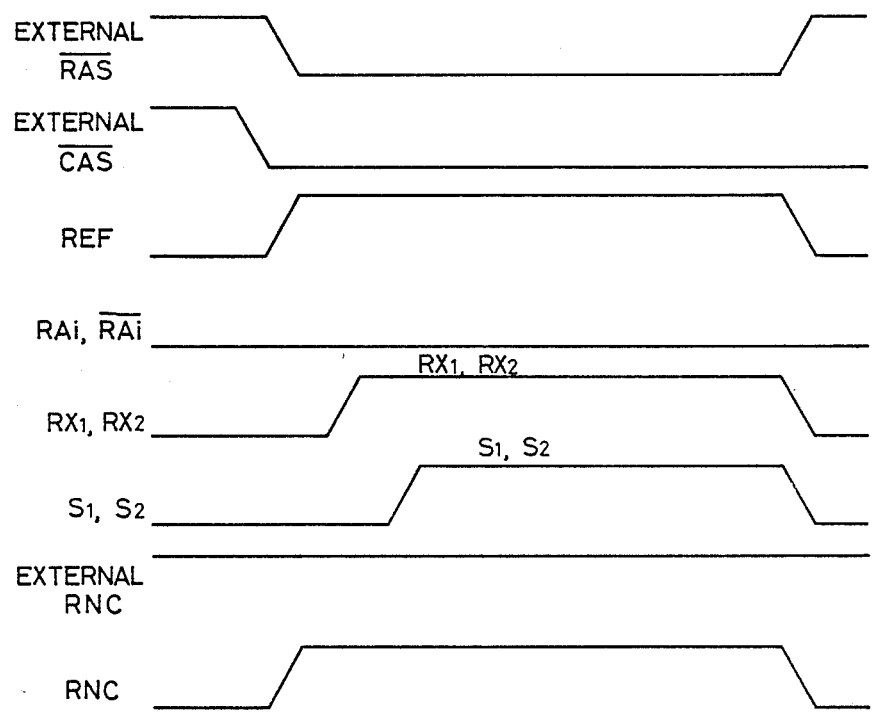
FIG. 6 is a timing chart showing generating timing of each signal at the time of an automatic refresh operation according to an embodiment of the present invention.

FIG. 6 is a timing chart showing generating timing of each signal at the time of an automatic refresh operation according to an embodiment of the present invention.

Referring now to FIGS. 5 and 6, the refresh operation according to the present embodiment will be described.

It is assumed that an external RNC signal which is an external control signal is at an "H" level which is more than a predetermined value. When an external $\overline{CAS}$ signal falls before an external $\overline{RAS}$ signal ($\overline{CAS}$ before $\overline{RAS}$), a refresh signal REF attains the "H" level in synchronization with the fall of the external $\overline{RAS}$ signal, to enter a refresh mode. The signal REF is applied to a sense restore control circuit 12 from a clock generator 14. Since the external RNC signal is at the "H" level, the sense restore control circuit 12 makes the control signal RNC to be the "H" level. The signal RNC, which attained the "H" level, is applied to a decode signal generating circuit 4, to inhibit both decode signals RAi and $\overline{RAi}$ used for operating memory cell arrays in a partitioned manner from attaining the "H" level. Consequently, both of row decoders 6a and 6b enter a selected state. The decode signal generating circuit 4, which received the RNC signal, does not select address information inputted from a row address buffer 2. Alternately, the decode signal generating circuit 4 receives a refresh address outputted from a refresh counter included in the sense restore control circuit 12, to employ the same as an internal address selecting signal of the row decoder. On the other hand, address information applied to the column decoder is not selected during a refresh operation in response to the RNC signal also applied to a column address buffer 3, so that a column system is not operated. The decode signals RAi and $\overline{RAi}$, which do not attain the "H" level, are applied to word line driving signal generating circuits 5a and 5b, respectively, to make word line driving signals $RX_1$ and $RX_2$ to be the "H" level. Respective one word lines in the memory cell arrays 8a and 8b are selected in response to the signals $RX_1$ and $RX_2$, respectively. A refresh operation of memory cells associated with the word lines is performed with sense amplifier activating signals $S_1$ and $S_2$ which attain the "H" level after the delay from the signals $RX_1$ and $RX_2$. The refresh operation is the same as that in the conventional example and hence, the description thereof is omitted. Subsequently, in the same manner, memory cells in each of the memory cell arrays 8a and 8b are successively refreshed in response to row addresses outputted from a refresh counter. Thus, the time required for refreshing the entire memory cell arrays 8a and 8b becomes one-half of that in the conventional example, which allows an efficient refresh operation.

Figure 7:
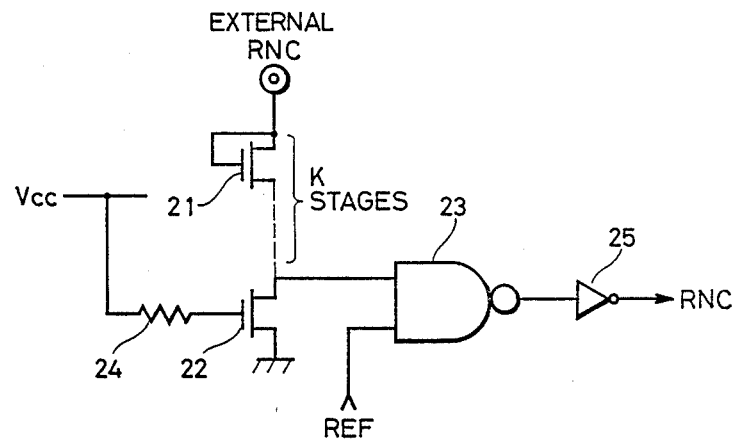
FIG. 7 is a diagram showing a generating circuit responsive to an external RNC signal and a signal REF for generating an RNC signal, according to the present invention.

FIG. 7 is a diagram showing a generating circuit responsive to the external RNC signal and the signal REF for generating an RNC signal according to the present embodiment.

In FIG. 7, MOS transistor 21 of k stages and MOS transistor 22 are connected in series between the external RNC signal and a ground potential. The MOS transistor 22 has its gate connected to a power-supply voltage $V_{CC}$ through a resistance 24. A node between the MOS transistor 21 and the MOS transistor 22 and the signal REF are connected to an input of an NAND circuit 23. An output of the NAND circuit 23 is connected to the RNC signal through an inverter 25. In this circuit, the MOS transistor 21 of k stages is effective in lowering a voltage applied to the external RNC signal. More specifically, it is not until a large voltage having a value which is more than a predetermined value is applied to the external RNC signal and the signal REF attains the "H" level that the RNC signal changes from a low level (referred to as "L" level hereinafter) to the "H" level.

Figure 8:
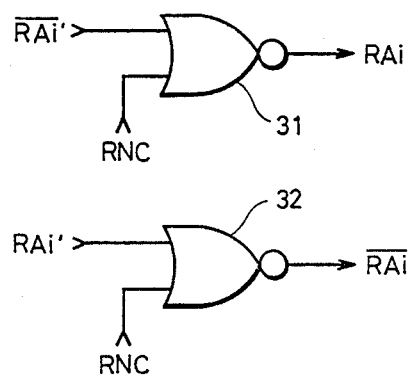
FIG. 8 is a diagram showing a generating circuit responsive to row address signals RAi and $\overline{RAi}$ and the RNC signal for generating decode signals RAi and $\overline{RAi}$, according to the present embodiment.

FIG. 8 is a diagram showing a generating circuit responsive to the row address signals RAi′ and $\overline{RAi}$′ and the RNC signal for generating decode signals RAi and $\overline{RAi}$ according to the present embodiment.

In FIG. 8, the row address signals RAi′ and $\overline{RAi}$′, together with the RNC signal, are connected to inputs of NOR circuits 31 and 32, respectively. Outputs of the NOR circuits 31 and 32 are connected to the decode signals RAi and $\overline{RAi}$, respectively. In this circuit, when the RNC signal attains the "H" level, both the decode signals RAi and $\overline{RAi}$ attain the "L" level irrespective of the levels of the signals RAi′ and $\overline{RAi}$′. The RNC signal is at the "L" level during the time other than the time of the refresh operation, so that either one of the signals RAi and $\overline{RAi}$ attains the "L" level in response to the "H" level of either one of the signals RAi′ and e,ovs/- RAi/ ′. More specifically, either one of the row decoders 6a and 6b is selected.

Figure 9:
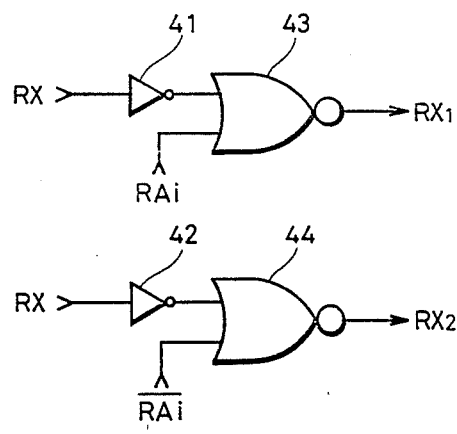
FIG. 9 is a diagram showing a generating circuit responsive to a timing signal RX and the decode signals RAi and $\overline{RAi}$ for generating word line driving signals $RX_1$ and $RX_2$, according to the present embodiment.

FIG. 9 is a diagram showing a generating circuit responsive to a timing signal RX and the decode signals RAi and $\overline{RAi}$ for generating the word line driving signals $RX_1$ and $RX_2$, according to the present embodiment.

In FIG. 9, the signal RX outputted from the clock generator 14, together with the signals RAi and $\overline{RAi}$, is connected to inputs of NOR circuits 43 and 44 through inverters 41 and 42, respectively. Outputs of the NOR circuits 43 and 44 are connected to the signals $RX_1$ and $RX_2$, respectively. In this circuit, since the signals RAi and $\overline{RAi}$ are at the "L" level, the signals $RX_1$ and $RX_2$ attains the "H" level in response to the "H" level of the signal RX.

Figure 10:
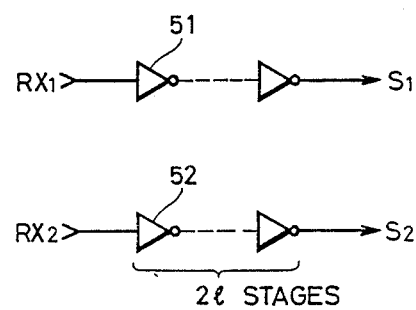
FIG. 10 is a diagram showing a generating circuit responsive to the word line driving signals $RX_1$ and $RX_2$ for generating sense amplifier activating signals $S_1$ and $S_2$, according to the present embodiment.

FIG. 10 is a diagram showing a generating circuit responsive to the word line driving signals $RX_1$ and $RX_2$ for generating sense amplifier activating signals $S_1$ and $S_2$, according to the present embodiment.

In FIG. 10, inverter circuits 51 and 52 of 21 stages are connected between the signals $RX_1$ and $S_1$ and between the signals $RX_2$ and $S_2$, respectively, to constitute a delay circuit.

By the foregoing circuits shown in FIGS. 7 to 10, various signals shown in FIG. 6 are generated in response to the respective changes of the external RNC signal and the signal REF. Thus, if the control mode is not a refresh mode or the external RNC signal is at the "L" level, either one of the decode signals RAi and $\overline{RAi}$ used for operating memory cell arrays in a block partitioned manner attains the "H" level. Consequently, either one of the signals $RX_1$ and $RX_2$, or either one of the signals $S_1$ and $S_2$ corresponding thereto attains the "H" level, so that an operation in a block partitioned manner is achieved so that only either one of the memory cell arrays 8a and 8b is refreshed. In the same manner, the same refresh operation as that in the conventional example can be performed.

Although in the above described embodiment, the refresh mode is controlled by the external RNC signal, it may be adapted such that the RNC signal is automatically made to be the "H" level if the active time of the external $\overline{RAS}$ signal is longer than a predetermined time, to simultaneously refresh both of the memory cell arrays, as described below.

Figure 11:
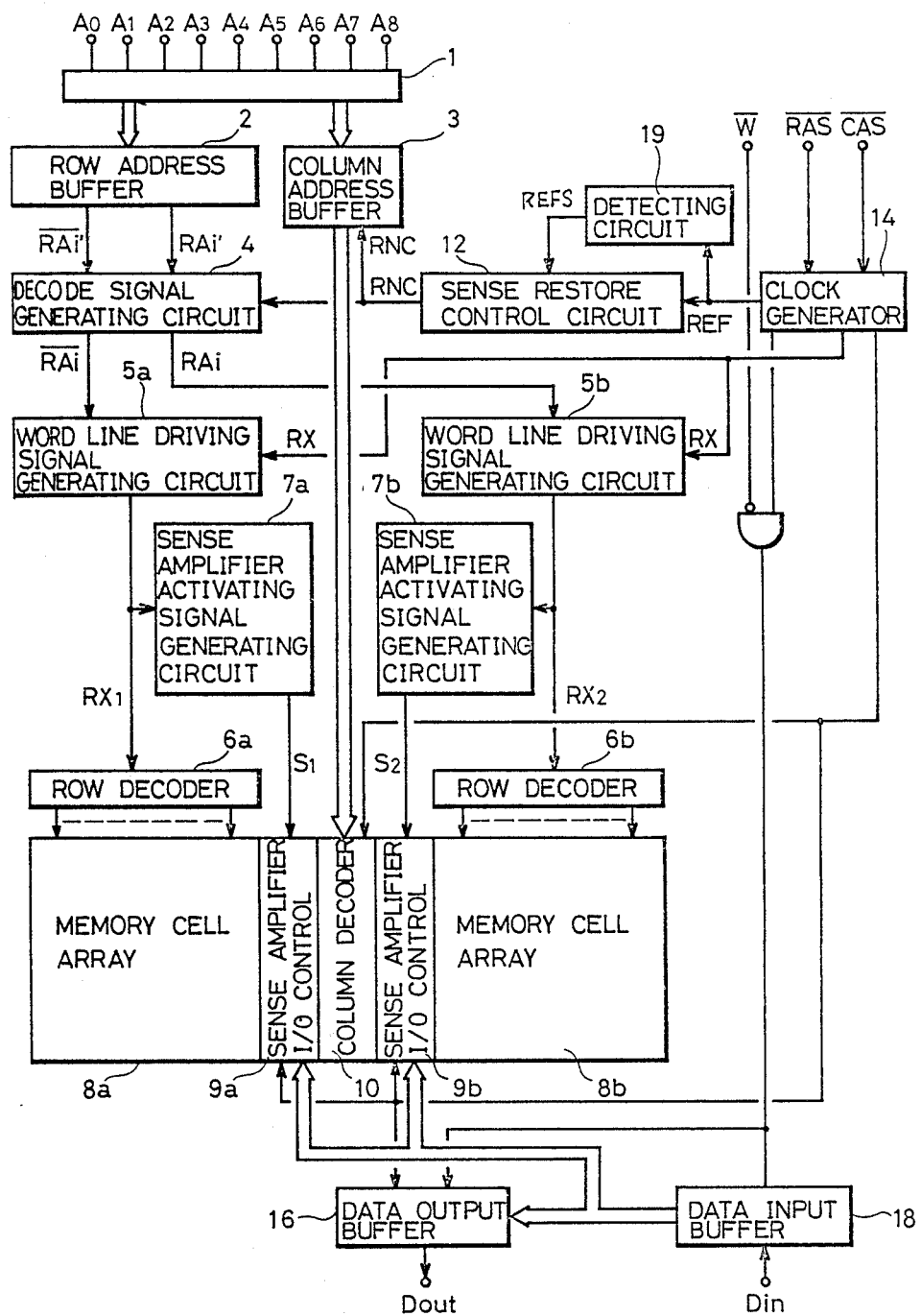
FIG. 11 is a block diagram showing a block partitioned MOS type DRAM according to another embodiment of the present invention.

FIG. 11 is a block diagram showing a block partitioned MOS type DRAM according to another embodiment of the present invention.

FIG. 11 is the same as the block diagram according to the previous embodiment except that the external RNC signal is not used and a detecting circuit 19 is provided. More specifically, in the present embodiment, a signal REF from a clock generator 14 is also inputted to the detecting circuit 19, and a signal REFS from the detecting circuit 19 is inputted to a sense restore control circuit 12. The other structure is the same as that according to the previous embodiment shown in FIG. 5 and hence, the description thereof is omitted herein.

Figure 12:
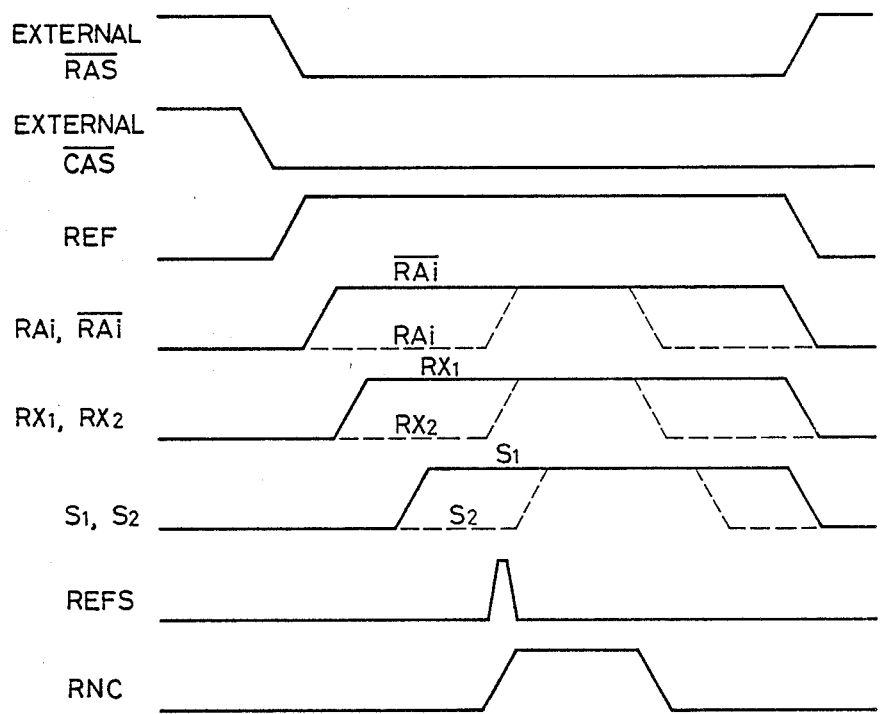
FIG. 12 is a timing chart showing generating timing of each signal at the time of an automatic refresh operation according to another embodiment of the present invention.

FIG. 12 is a timing chart showing generating timing of each signal at the time of an automatic refresh operation according to the present embodiment.

Referring now to FIGS. 11 and 12, the refresh operation according to the present embodiment will be described.

When an external $\overline{CAS}$ signal falls before an external $\overline{RAS}$ signal ($\overline{CAS}$ before $\overline{RAS}$), the signal REF attains the "H" level in synchronization with the fall of the external $\overline{RAS}$ signal, to enter a refresh mode. The signal REF is applied to the sense restore control circuit 12 from the clock generator 14. An RNC signal remains at the "L" level in a predetermined time period during which the "L" level of the external $\overline{RAS}$ signal is maintained. Thus, similarly to the normal write/read operation, either one of decode signals RAi and $\overline{RAi}$ ($\overline{RAi}$ in the present embodiment) attains the "H" level in response to row address signals RAi' and $\overline{RAi}$'. A signal $RX_1$ and a signal $S_1$ attain the "H" level successively in response to the "H" level of the signal $\overline{RAi}$, so that a refresh operation of memory cells in either one of the memory cell arrays 8a and 8b is started, similarly to the conventional example. In the present embodiment, if the "L" level of the external $\overline{RAS}$ signal is maintained in a predetermined time period or more, that is, the "H" level of the signal REF is maintained in a predetermined time period or more, the pulse signal REFS is generated from the detecting circuit 19. The signal RAi, which is at the "L" level, attains the "H" level in response to the signal REFS. A signal $RX_2$ and a signal $S_2$ attain the "H" level successively in response to the "H" level of the signal RAi, so that a refresh operation of memory cells in a non-selected memory cell array of the memory cell arrays 8a and 8b is started.

In the same manner, the active time of the external $\overline{RAS}$ signal is controlled, so that refresh operations corresponding to two cycles can be performed in one cycle of the external $\overline{RAS}$ signal, whereby the refresh efficiency can be increased.

Figure 13:
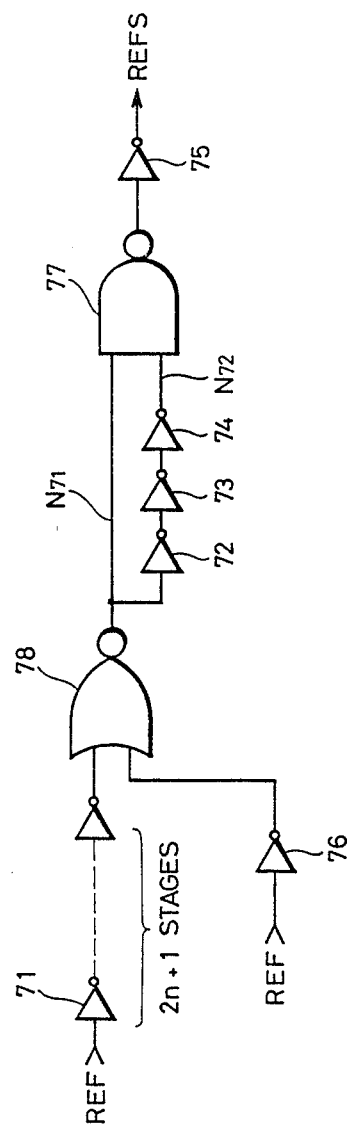
FIG. 13 is a circuit diagram showing specific structure of a detecting circuit shown in FIG. 11.

FIG. 13 is a circuit diagram showing specific structure of the detecting circuit 19 shown in FIG. 11.

In FIG. 13, the signal REF through inverters 71 of (2n+1) stages and the signal REF through an inverter 76 are connected to inputs of a NOR circuit 78, respectively. An output of the NOR circuit 78 is branched into a node N71 and a node N72 through inverters 72, 73 and 74. The nodes N71 and N72 are connected to inputs of a NAND circuit 77, respectively. An output of the NAND circuit 77 is connected to the signal REFS through an inverter 75. In this circuit, since the signal REF is at the "L" level before the refresh operation, the node N71, the node N72 and the REFS signal are all at the "L" level. After the refresh operation, the signal REF attains the "H" level. However, the levels of the nodes N71 and N72 are not immediately changed due to the delay effect of the inverter 71. The signal REFS remains at the "L" level. When the signal REF of the "H" level is transmitted to a delay stage comprising the inverters 71, the node N71 attains the "H" level. However, since the node N72 is at the "H" level due to the delay effect of the inverters 72, 73 and 74, the signal REFS attains the "H" level at the time point. When transmission of the signal to the delay stage comprising the inverters 72, 73 and 74 is completed so that the node N72 attains the "L" level, the signal REFS is changed from the "H" level to the "L" level. In the same manner, a pulse-shaped REFS signal is obtained.

Figure 14:
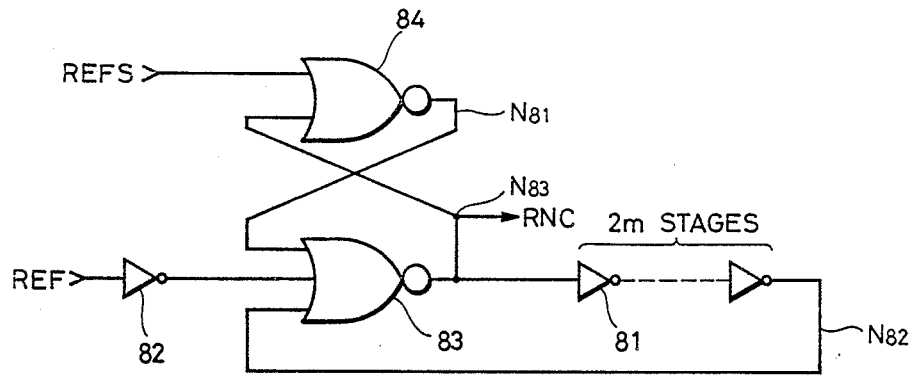
FIG. 14 is a diagram showing a generating circuit responsive to a signal REF and a signal REFS for generating a control signal RNC, in FIG. 11.

FIG. 14 is a generating circuit responsive to the signal REF and the signal REFS for generating a control signal RNC, in FIG. 11. The generating circuit is included in the sense restore control circuit 12.

In FIG. 14, NOR circuits 83 and 84 constitute a flip-flop circuit. The NOR circuit 83 has inputs connected to the signal REF through an inverter 82, a node N81 connected to an output of the NOR circuit 84, and a node N82 connected through inverters 81 of 2m stages to an output of the NOR circuit 83. The NOR circuits 84 have inputs connected to the signal REFS and a node N83 connected to the output of the NOR circuit 83. The node N83 is connected to the RNC signal. In this circuit, when the signal REF is at the "H" level and the signal REFS is at the "L" level, the node N81 is at the "H" level, so that the node N83, i.e., the RNC signal is at the "L" level. When the signal REFS is changed to the "H" level as shown in FIG. 13, the node N81 attains the "L" level. As a result, the node N83, i.e., the RNC signal attains the "H" level. At this time point, the node N82 is at the "L" level due to the delay effect of the inverter 81. However, when transmission of the signal to a delay stage comprising the inverter 81 is completed, the node N82 attains the "H" level, so that the "H" level is inputted to the NOR circuit 83. Consequently, the RNC signals is changed from the "H" level to the "L" level. If the RNC signal changed to the "L" level is passed through the delay stage comprising the inverter 81, the node N81 attains the "H" level because the signal REFS has already been at the "L" level. As a result, the RNC signal remains at the "L" level. Thus, it is necessary to set the time period during which the RNC signal remains at the "H" level to the time period required for the refresh operation performed by selecting a single word line in the memory cell array 8b. More specifically, it is necessary to set the delay stage comprising the inverter 81 in response to this refresh time.

The foregoing circuits shown in FIGS. 13 and 14 are incorporated, so that the external RNC signal is not required, unlike the previous embodiment. Consequently, a refresh operation of only one or both of the memory cell arrays can be flexibly controlled by controlling the active time period of the external $\overline{RAS}$ signal. More specifically, if the "L" level of the external $\overline{RAS}$ signal, i.e., the "H" level of the signal REF is changed before transmission to the delay stage of the inverter 71 is completed, a pulse of the signal REFS is prevented from being produced by the action of the signal REF through the inverter 76. Consequently, the RNC signal of the "H" level is not generated, so that only the memory cell array 8a is refreshed. In addition, the present embodiment has the following advantage. For example, it is assumed that the RNC signal attains the "H" level, so that memory cells in a non-selected memory cell array is refreshed. In this case, even if the active time period at the "L" level of the external $\overline{RAS}$ signal is forced to be ended by some action, the refresh operation is not affected. The reason is that the signal REF is naturally changed from the "H" level to the "L" level in response to the end of the active time period of the external $\overline{RAS}$ signal. Unit transmission of the RNC signal, i.e., the "H" level of the node N83 to the node N82 is completed due to the delay effect of the inverter 81, the node N82 remains at the "L" level. Thus, the output of the NOR circuit 83 remains at the "H" level since in a transmission time period in the inverter 81, an output of the RNC signal is interlocked until the refresh operation is terminated not to change the output thereof. Consequently, a malfunction such as interruption of the refresh operation is prevented.

Although in the above described both embodiments, description was made on the $\overline{CAS}$ before $\overline{RAS}$ automatic refresh operation, the present invention can be applied to the other refresh operations in a state in which the column system is not operated, such as an RAS only refresh operation. If the state in which the column system is not operated is interlocked in response to the RNC signal, the present invention can be also applied. More specifically, if the state in which the column system is not operated is maintained in the refresh mode, a malfunction does not occur, so that the present invention can be applied to any refresh operation.

Furthermore, although in the above described both embodiments, generating circuits of various signals are specified, the method for generating the signals is not limited to the circuits. For example, the other circuit or the other apparatus may be employed which generates a signal of timing shown in FIGS. 6 and 12.

Additionally, although in the above described both embodiments, the present invention is applied to a block partitioned DRAM, the concept of the present invention can be applied to a block non-partitioned DRAM if a memory cell array can be partitioned only for a refresh operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device which can perform an access operation for all memory cell arrays therein, comprising:
    a plurality of partitioned memory cell arrays each having matrices of memory cells arranged therein,
    a plurality of refresh means with a refresh means provided in each of said memory cell arrays for refreshing said memory cells,
    mode defining means for defining a normal access mode and a refresh mode, and
    refresh control means for simultaneously activating all of said refresh means in the refresh mode defined by said mode defining means.

2. A dynamic semiconductor memory device according to claim 1, wherein
    said mode defining means is responsive to the level of a refresh signal generated by a refresh signal generating means for defining said access mode and said refresh mode.

3. A dynamic semiconductor memory device according to claim 1, wherein
    said mode defining means comprises refresh signal generating means for generating a refresh signal, and is responsive to the level of the refresh signal generated by said refresh signal generating means for defining said refresh mode.

4. A dynamic semiconductor memory device which can perform an access operation for all memory cell arrays therein, comprising:
    a plurality of partitioned memory cell arrays each having a plurality of memory cells arranged in a plurality of rows and columns,
    a plurality of row selecting means each provided in each of said memory cell arrays for selecting the memory cells in every designated row,
    a plurality of column selecting means each provided in each of said memory cell arrays for selecting the memory cells in each designated column,
    mode defining means for defining a normal access mode and a refresh mode,
    matrix selecting control means for designating a row of the memory cells selected by said column selecting means and not designating a column of the memory cells selected by said row selecting means, in the refresh mode defined by said mode defining means,
    a plurality of refresh means with a refresh means provided in each of said memory cell arrays for refreshing the memory cells in the column selected by said column selecting means, and
    refresh control means for simultaneously activating all of said refresh means in the refresh mode defined by said mode defining means.

5. A dynamic semiconductor memory device according to claim 4, wherein
    said matrix selecting control means designates the row and the column of the memory cells selected by said row selecting means and said column selecting means, in the access mode defined by said mode defining means.

6. A dynamic semiconductor memory device according to claim 4, wherein
    said mode defining means is responsive to the level of a refresh signal generated by a refresh signal generating means for defining said access mode and said refresh mode.

7. A dynamic semiconductor memory device according to claim 4, wherein
    said mode defining means comprises refresh signal generating means for generating the refresh signal, and is responsive to the level of the refresh signal generated by said refresh signal generating means for defining said refresh mode.

8. A dynamic semiconductor memory device according to claim 7, wherein said refresh signal generating means comprises
    first signal generating means for generating a first signal for determining timing of accepting a signal which designates the row of the memory cells selected by said row selecting means in the access mode defined by said mode defining means, and
    second signal generating means for generating a second signal for determining timing of accepting a signal which designates the column of the memory cells selected by said column selecting means in the access mode defined by said mode defining means,
    said refresh signal generating means generating said refresh signal when the first signal generated by said first signal generating means and the second signal generated by said second signal generating means have a predetermined relation.

9. A dynamic semiconductor memory device according to claim 4, which further comprises
    refresh detecting means for detecting termination of a refresh operation of the memory cells for every one column by said refresh means,
    said matrix selecting control means comprising refresh address generating means for generating rows of memory cells to be refreshed in order, and designating successively the rows of the memory cells generated by said refresh address generating means in response to detecting output from said refresh detecting means.

* * * * *